(12) United States Patent
Kenington

(10) Patent No.: US 6,549,067 B1
(45) Date of Patent: Apr. 15, 2003

(54) METHOD AND APPARATUS FOR LINEARIZING AN OUTPUT SIGNAL

(75) Inventor: Peter Kenington, Chepstow (GB)

(73) Assignee: Andrew Corporation, Orland Park, IL (US)

( * ) Notice: Subject to any disclaimer, the term of this patent is extended or adjusted under 35 U.S.C. 154(b) by 0 days.

(21) Appl. No.: 09/958,118

(22) PCT Filed: Mar. 30, 2000

(86) PCT No.: PCT/GB00/01220

§ 371 (c)(1),
(2), (4) Date: Oct. 1, 2001

(87) PCT Pub. No.: WO00/60732

PCT Pub. Date: Oct. 12, 2000

(30) Foreign Application Priority Data

Apr. 1, 1999 (GB) .............................................. 9907725

(51) Int. Cl.[7] ................................................ H03F 3/66
(52) U.S. Cl. ......................................... 330/52; 330/149
(58) Field of Search ................................ 330/52, 149

(56) References Cited

U.S. PATENT DOCUMENTS

| | | | |
|---|---|---|---|
| 4,329,655 A | | 5/1982 | Nojima et al. |
| 5,381,108 A | * | 1/1995 | Whitmarsh et al. ......... 330/107 |
| 5,650,758 A | | 7/1997 | Herzog et al. |
| 5,699,383 A | * | 12/1997 | Ichiyoshi ................... 330/149 |
| 5,923,712 A | * | 7/1999 | Leyendecker et al. ...... 455/126 |
| 6,298,096 B1 | * | 10/2001 | Burgin ....................... 330/149 |

FOREIGN PATENT DOCUMENTS

| | | |
|---|---|---|
| GB | 2283629 | 5/1995 |
| WO | WO 98/01945 A1 | 1/1998 |

* cited by examiner

Primary Examiner—Robert Pascal
Assistant Examiner—Khanh Van Nguyen

(57) ABSTRACT

The digital transmission sub-system comprises a DSP (100) which takes as its inputs the in-phase and quadrature channels of a baseband software radio stage. The in-phase and quadrature inputs are separately digitally predistorted (110, 120) and digitally up-converted (128) to the intermediate frequency (IF) band. The IF band signal is then converted (130) to an analogue signal which is up-converted to the radio frequency band at (134) prior to amplification at (140) to produce an RF output signal for radiation from an antenna. The predistors (110 and 120) predistort the incoming signals to counter distortion arising from the up-conversion and amplification processes within the transmission subsystem in order to linearise the RF output. The predistorters (110, 120) may be adapted using a feedback signal supplied to the DSP (100) from a splitter (142) at the output of the sub-system. The feedback mechanism may involve analogue correlation processes to permit the use of slower analogue to digital converters for providing the feedback to the DSP (100) (FIGS. 4 and 5).

40 Claims, 8 Drawing Sheets

METHOD AND APPARATUS FOR LINEARIZING AN OUTPUT SIGNAL

CROSS-REFERENCE TO RELATED APPLICATION

This application claims the benefit of International Application No. PCT/GB00/01220 filed Mar. 30, 2000 and published in English, which in turn claims priority based on GB 9907725.7 filed Apr. 1, 1999.

FIELD OF THE INVENTION

This invention relates to signal processing apparatus of the kind in which an input signal is subject to both amplification and frequency conversion; and especially relates to radio telecommunications apparatus in which a voice signal is subject to amplification and frequency conversion.

BACKGROUND OF THE INVENTION

The emerging GSM-EDGE and UMTS standards for mobile telecommunications place an increasingly stringent requirement on the linearity of handsets, particularly given their proposed wider channel bandwidths. In order to realise a power-efficient handset design, some form of linearisation will be required in the handset transmitter which should be (i) low-power itself; (ii) capable of broadband linearisation (up to 5 MHz for UMTS/ULTRA; (iii) frequency flexible, and preferably multi-band; and (iv) capable of achieving and maintaining high-levels of linearity improvement with highly-non-linear power amplifiers (e.g. class-C).

According to one aspect, the invention consists in a method of linearising an output signal comprising the steps of providing an input signal, digitally predistorting the input signal using polynomial distortion generation and frequency converting it in succession to provide a predistorted, frequency-converted signal, and amplifying the predistorted, frequency-converted signal to produce an output signal.

The trend in base-station technology is toward the adoption of "software radio" techniques, i.e. architectures in which all of the modulation parameters, ramping, framing etc. take place for all channels at baseband (digitally). The combination of all channels, at appropriate frequency offsets from each other, can also be performed at baseband and the whole spectrum up-converted in a single block for multi-carrier power amplification and the transmission from a single antenna.

SUMMARY OF THE INVENTION

However, the up-conversion and power amplification need to be linear (low-distortion) in order to prevent the radiation of unwanted adjacent channel energy and hence some form of linearisation is usually required for the power amplifier. In one embodiment of the present invention, the system incorporates a digital baseband (or digital IF) interface between a baseband signal generation sub-system and a linearised transmitter sub-system performing the above method.

With the invention it is possible to allow the transmitter to become a digital-in, RF-out system with the linearisation taking place in the form of digital predistortion.

In one embodiment, the predistortion of the input signal occurs prior to its frequency conversion. Advantageously, the frequency converting step is a frequency up-conversion step.

The input signal may be provided in quadrature form comprising in-phase and quadrature channels and the predistorting step may involve predistorting each channel independently.

Advantageously, the predistortion process may involve controlling the amplitude and/or phase of some part of the predistortion. This may involve controlling the predistortion to introduce a variation of amplitude and/or phase with frequency into at least a part of the predistortion.

In one embodiment, the predistortion may be controlled on the basis of a feedback signal derived from the output signal. In such an embodiment, it is possible to inject a pilot signal into the input signal and to monitor distortion of the pilot signal in the output signal as feedback. The feedback may be used together with the generated predistortion to generate control signals controlling the predistortion. The generation of these control signals may involve the step of correlating, or mixing, predistortion with feedback. It may be advantageous to perform the step of using the predistortion together with the feedback signal to generate control signals for the predistortion at least partly in the analogue signal domain.

The predistorting process may involve generating a distortion from the input signal and reintroducing the generated distortion into the input signal. The distortion signal may be generated by mixing or multiplying the input signal with itself. The step of generating a predistortion may involve generation of different orders of distortion by mixing the input signal with itself a different number of times. Advantageously, different orders of distortion can be controlled separately.

In a preferred embodiment, the frequency conversion and predistortion processes occur within a digital signal processor.

Any of the various methods described above may be used to generate an output signal for transmission from antenna means using an input signal which has been created in the digital domain and which contains information which it is desired to transmit.

According to another aspect, the invention relates to apparatus for linearising an output signal comprising predistorting means for digitally predistorting the input signal using polynomial distortion generation and frequency converting means operating in succession on an input signal to produce a predistorted, frequency-converted signal, the apparatus further comprising amplifying means for amplifying the predistorted, frequency-converted signal to produce an output signal.

Certain embodiments of the invention will now be described, by way of example only, with reference to the figures, in which.

Figure 1:
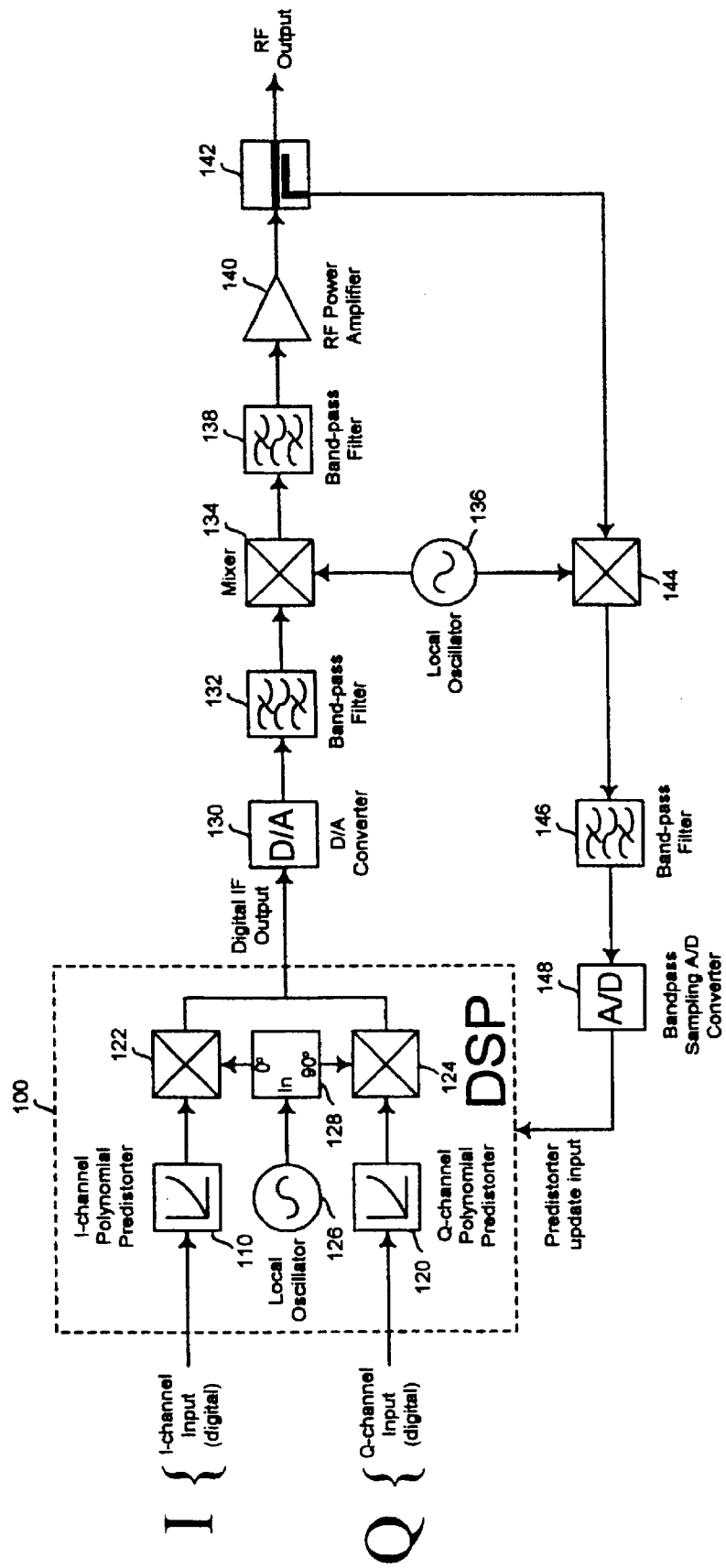
FIG. 1 is a diagram illustrating a digital transmission sub-system linearisation scheme.

FIG. 1 illustrates a basic digital transmitter linearisation system utilising polynomial-based predistorters. The baseband, digital input signal to the system is provided by, for example, a "software radio" architecture in which all of the modulation parameters, ramping, framing, etc. take place for all channels digitally at baseband. This input for the transmitter system of FIG. 1 is provided in the form of digital in-phase and quardrature channel inputs, I and Q respectively, which are supplied to digital signal processor (DSP) 100.

The in-phase channel input signal is digitally predistorted using in-phase channel polynomial predistorter 110, whereas the quadrature channel input signal is digitally predistorted using quadrature channel polynomial predistorter 120. The outputs from predistorters 110 and 120 are mixed, using mixers 122 and 124 respectively, into in-phase and quadrature versions respectively of a signal from local oscillator 126 by way of quadrature splitter 128. The outputs from mixers 122 and 124 are then combined digitally to produce an intermediate frequency (IF) band output signal which is converted to an analogue signal by digital to analogue converter 130. The analogue IF output signal is then bandpass filtered at 132 and, using mixer 134, is subsequently mixed with the output from local oscillator 136 to produce a signal up-converted to the radio frequency (RF) band. This RF signal is then bandpass filtered at 138 prior to being amplified by non-linear RF power amplifier 140 which provides the system output to for example, an antenna of a hand-set or base station. The purpose of the predistorters 110 and 120 in the DSP 100 is to compensate for the non-linear characteristics of the RF power amplifier (PA) 140, and possibly also of the up-conversion process, in order to linearise the response of the entire transmitter system.

The predistorters 110 and 120 function by applying a predistortion to the I and Q input channels respectively which compensates for the distortion caused by the PA 140 (and possibly also by the up-conversion process). The characteristics of the predistortions applied at 110 and 120 are controlled on the basis of a feedback signal derived from the output of PA 140 using splitter 142. The portion of the PA output fed back from this splitter is coherently downconverted by mixing it with the output of local oscillator 136 which is used to up-convert the IF signal in the main signal path. The result of this mixing process, which takes place at mixer 144, is filtered at 146 prior to being converted to a digital signal at 148 which is supplied to the DSP 100 in order to provide feedback control for the predistorters 110 and 120.

The transmitter system of FIG. 1 can be adapted in a number of ways. For example, the DSP 100 could be provided with analogue to digital converters at the in-phase and quadrature channel inputs in order to provide compatibility with an analogue baseband stage, rather than a "software radio" architecture as discussed above. Furthermore, the input to the DSP 100 could be a digital or analogue IF band input signal, which could be quadrature downconverted digitally (after any necessary analogue to digital conversion) in the DSP prior to being processed as discussed above with reference to FIG. 1. Further modifications could also be made. For example, multi-stage upconversion from the IF to the RF band could be employed and/or an amplitude and phase polynomial model could be used in place of the in-phase and quadrature (Cartesian) model employed in FIG. 1. The up-conversion of the predistorted signal to the IF band and beyond can take place in the analogue signal domain.

Figure 2:
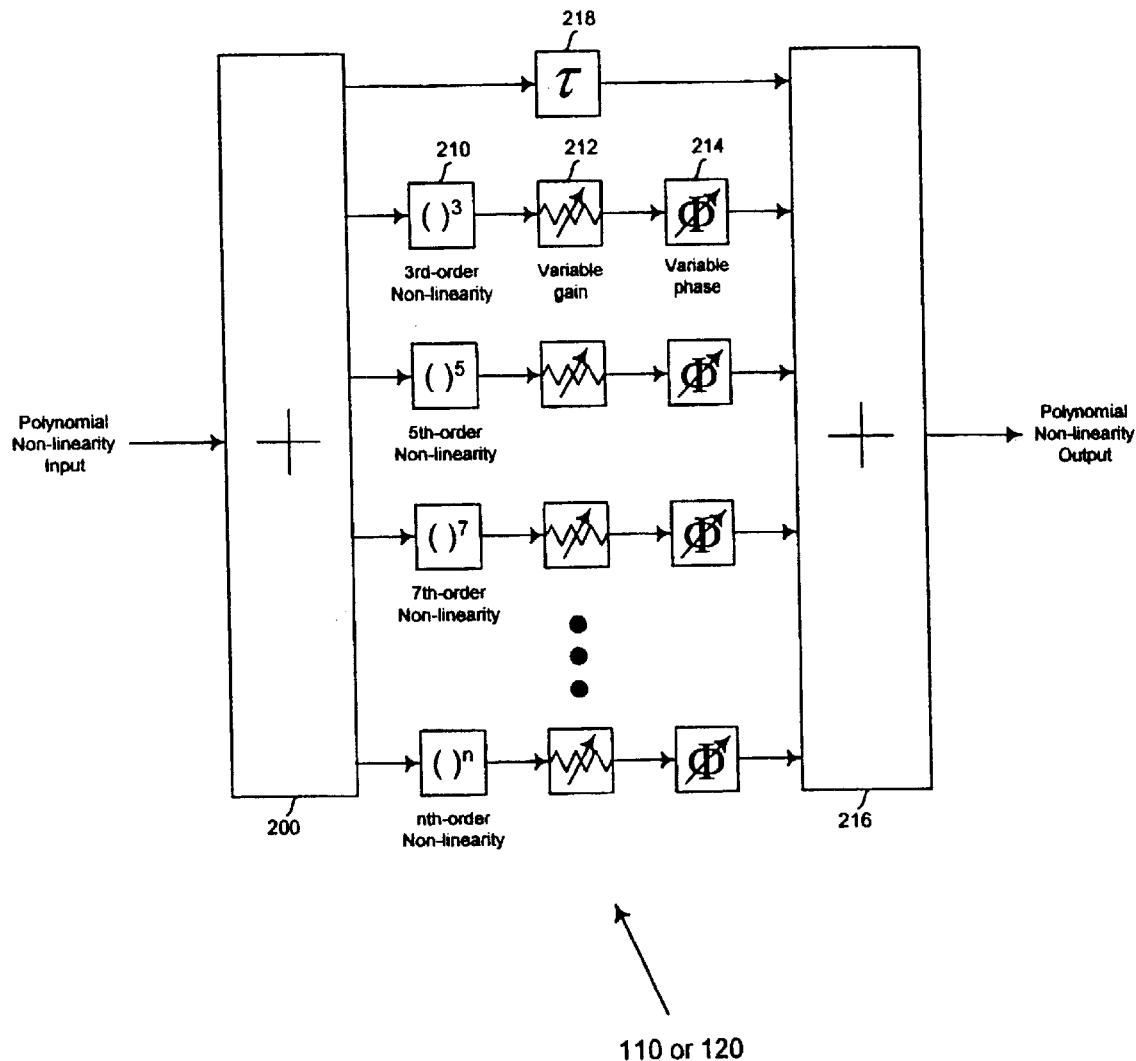
FIG. 2 is a diagram of a predistorter.

FIG. 2 illustrates the form of the predistortion circuit employed for each of the predistorters 110 and 120 used in the FIG. 1 system. The in-phase or, as the case may be, quadrature channel input signal is provided to splitter 200 which distributes it to the various components of the predistorter to generate various orders of distortion (to be explained later). For example, the input signal from splitter 200 is provided to third order non-linearity generator 210 to generate a third order non-linearity which is gain and phase adjusted at 212 and 214 respectively, before being supplied to combiner 216. Any additional orders of distortion, for example, the fifth, seventh and nth, are generated and adjusted in a similar manner, and are supplied to combiner 216.

In the combiner 216, the adjusted non-linearities are recombined with the input signal to the splitter 200 which passes to the combiner 216 by way of delay element 218 which compensates the input signal for the delay experienced by the signals in the non-linearity generating paths for the various orders of distortion. Thus, the signal output from combiner 216 to mixer 122 or, as the case may be, mixer 124 comprises the sum of the predistorter input signal and the independently adjusted and generated orders of distortion.

Figure 3:
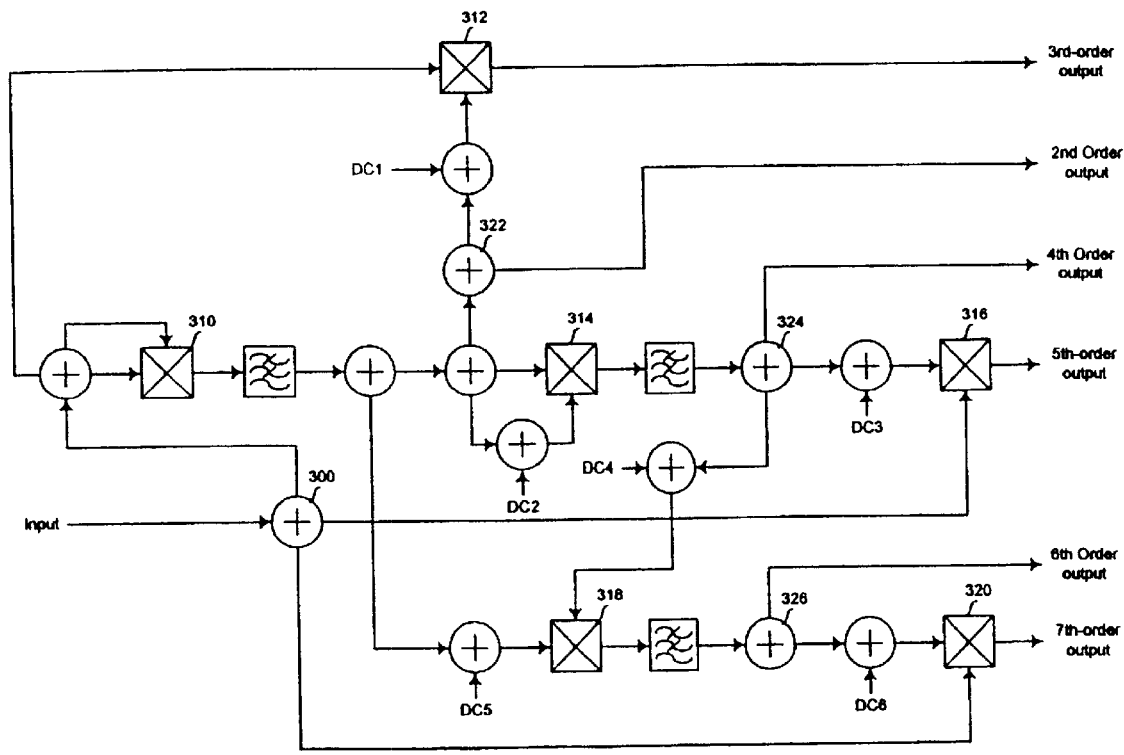
FIG. 3 is a diagram of a non-linearity generating circuit.

A process by which the different orders of distortion can be generated for independent control will now be described with reference to FIG. 3. Essentially, each order of distortion is created by multiplying an input signal (i.e. the in-phase or quadrature digital input channel as supplied to the splitters 200 in predistorters 110 and 120) with itself. This process is described in detail in UK Patent Application 9804745.9. In FIG. 3, the input signal, in addition to being supplied to delay element 218 in FIG. 2, is supplied to splitter 300 which thus performs the function of splitter 200 in FIG. 2.

Figure 4:
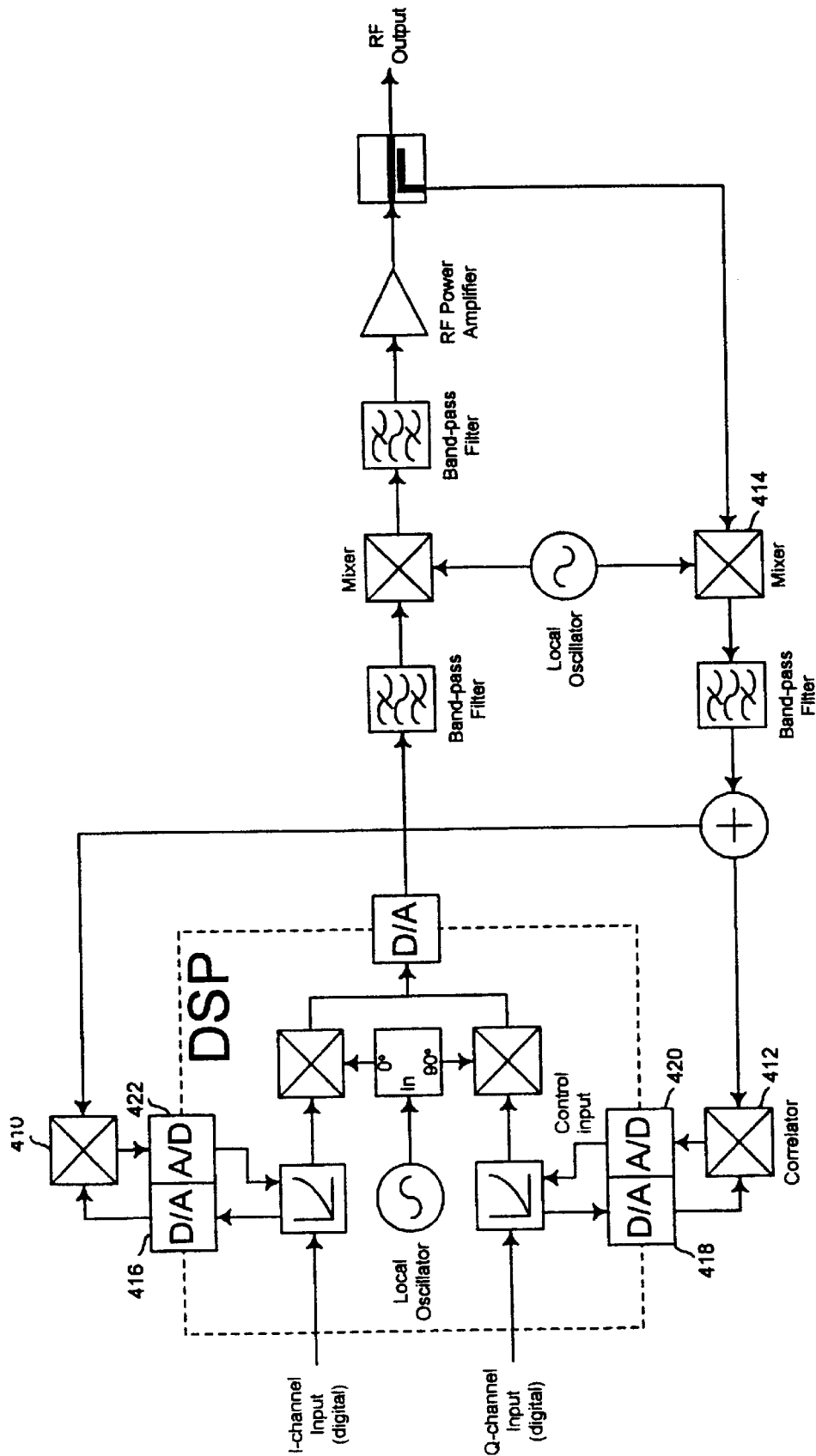
FIG. 4 is a diagram illustrating a digital transmission sub-system linearisation scheme.

In the FIG. 1 embodiment, a high speed analogue to digital converter may be required to sample the IF band feedback signal. The embodiment of FIG. 4 avoids the use of resource-draining fast analogue to digital converters by using correlation processors external to the DSP as a method of simply reducing the required sampling rate of the analogue to digital converters. Only a single correlator (mixer) is shown in each of the feedback paths to the in-phase and quadrature channel predistorters (correlators 410 and 412), but the principle may be extended to a number of correlators and hence a number of orders of distortion as will be discussed later with reference to FIGS. 5a–5c. In other respects, the embodiment of FIG. 4 is similar to that of FIG. 1.

It will be apparent to the skilled person that this scheme can be extended to any desired order of distortion generation. It will also be noted that second, fourth and sixth order distortion signals can be extracted at taps 322, 324 and 326, respectively, and these even-order distortion signals may be used in forms of predistortion control.

Figure 5A:
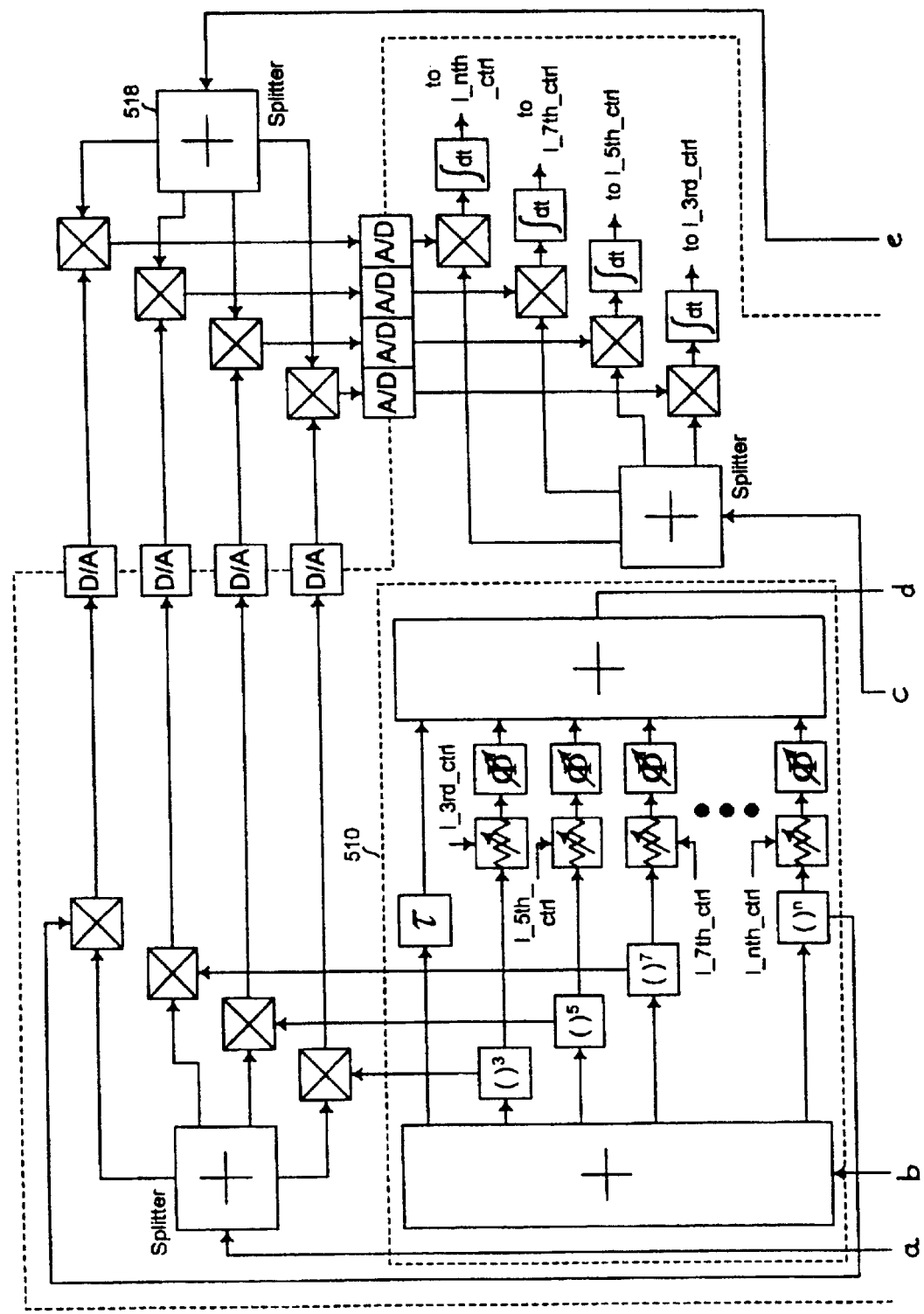
FIGS. 5(a–c) is a diagram illustrating a digital transmission sub-system linearisation scheme.
Figure 5B:
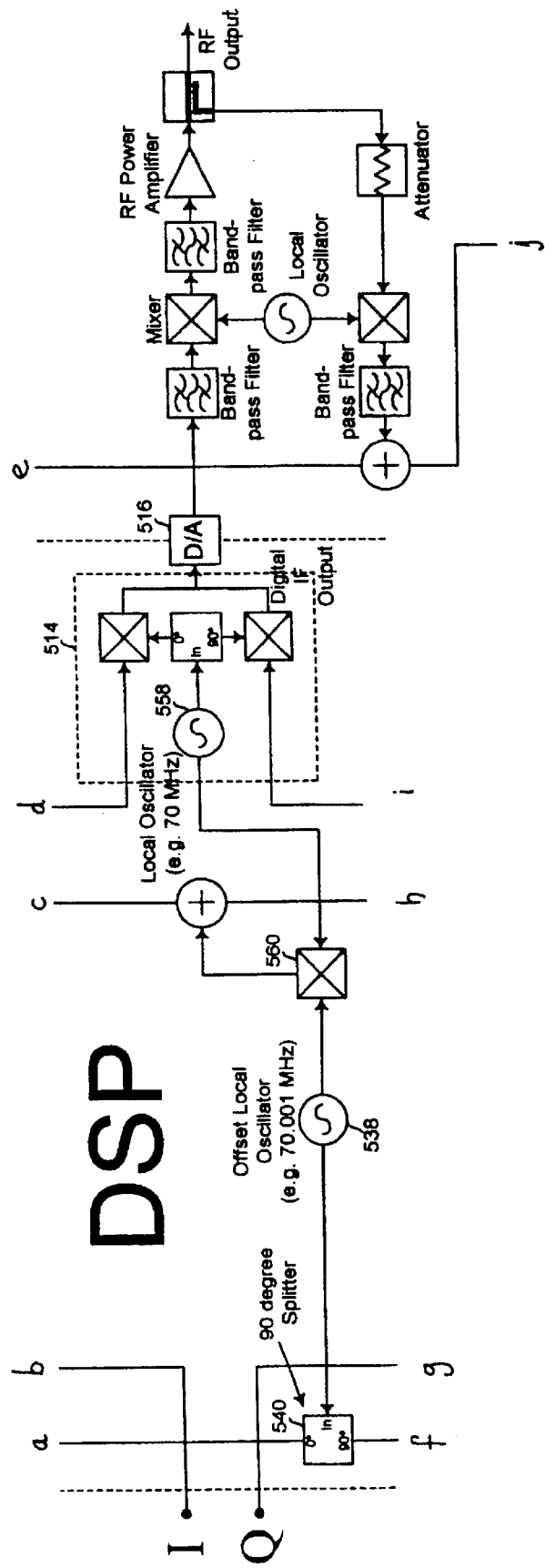
Figure 5C:
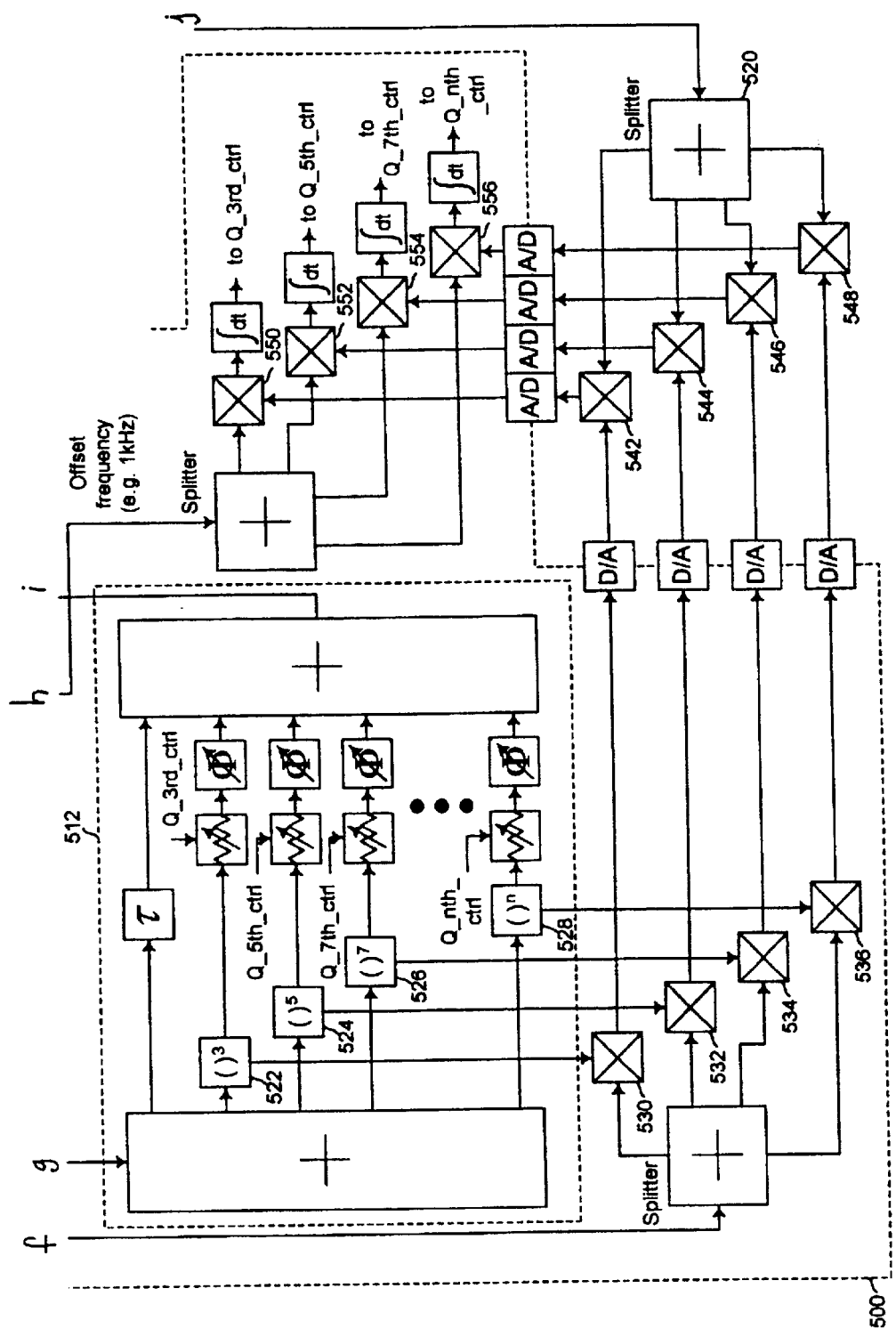

The operation of these correlating processes and their extension to multiple distortion orders will now be explained with reference to FIGS. 5a–5c. In the embodiment shown in these figures, the I and Q channel digital inputs are provided to digital signal processor 500 which comprises two independent predistorters 510 and 512 which operate on the I and Q channel inputs respectively. The predistorters 510 and 512 are each constituted as described with reference to FIGS. 2 and 3. An upconverter 514 frequency upconverts the I and Q predistorted signals to provide an IF band signal which is then transferred to the analogue portion of the circuit via digital to analogue converter 516. The analogue portion of the system functions in the same manner as described for the embodiment of FIG. 1 with the exception that the I and Q feedback paths terminate in splitters 518 and 520 which feed the correlation processes (described below).

An advantage of this approach to predistortion generation, is that the processing is quite simple, with each of the mixer blocks (310,312, etc) simply being equivalent to a multiplication which involves only a single instruction cycle in most DSPs. The predistortion generation mechanism operates directly on the input signals supplied at 300, and hence no memory is required to store coefficients, unlike some conventional forms of baseband predistortion generation where the memory requirement may be large, or if it is reduced, real-time interpolation calculations must be performed, thereby increasing the processing power requirement.

In the FIG. 1 embodiment, a high speed analogue to digital converter may be required to sample the IF band feedback signal. The embodiment of FIG. 4 avoids the use of resource-draining fast analogue to digital converters by using correlation processors external to the DSP as a method of simply reducing the required sampling rate of the analogue to digital converters. Only a single correlator (mixer) is shown in each of the feedback paths to the in-phase and quadrature channel predistorters (correlators 410 and 412), but the principle may be extended to a number of correlators and hence a number of orders of distortion as will be discussed later with reference to FIG. 5. In other respects, the embodiment of FIG. 4 is similar to that of FIG. 1.

This technique operates by correlating a version of the relevant baseband distortion component (for example, third order), following frequency-offset up-conversion to the IF band and digital to analogue conversion (416,418), with the downconverted (at 414) feedback signal from the amplifier output. The control signal acts to minimise this correlation result, as this will minimise the residual distortion at the output of the amplifier. The use of a small frequency offset when upconverting the distortion component ensures that the wanted IF band correlator result is at an appropriate (audio) frequency, thus removing any problems with DC offsets at the correlator output. The audio frequency result of the correlation may then be sampled by a low sample rate converter (420,422) and detected within the DSP, which eliminates the possibility of DC drifts.

It will be appreciated that although this approach uses high sampling rate digital to analogue converters (416,418) to supply the offset baseband distortion output, this solution will, however, involve lower cost and lower power consumption than the high sampling rate analogue to digital converters which would otherwise be used in the provision of the feedback signal to the DSP in FIG. 1 embodiment (even taking into consideration the additional cost and power consumption of the low sample rate analogue to digital converters 420,422). The dynamic range (number of bits) required of the digital to analogue converters 416 and 418 will also be much smaller than that required in the analogue to digital converters of the feedback path of the FIG. 1 embodiment. This results in a further cost and power saving.

The operation of these correlating processes and their extension to multiple distortion orders will now be explained with reference to FIG. 5. In the embodiment shown in this figure, the I and Q channel digital inputs are provided to digital signal processor 500 which comprises two independent predistorters 510 and 512 which operate on the I and Q channel inputs respectively. The predistorters 510 and 512 are each constituted as described with reference to FIGS. 2 and 3. An upconverter 514 frequency upconverts the I and Q predistorted signals to provide an IF band signal which is then transferred to the analogue portion of the circuit via digital to analogue converter 516. The analogue portion of the system functions in the same manner as described for the embodiment of FIG. 1 with the exception that the I and Q feedback paths terminate in splitters 518 and 520 which feed the correlation processes (described below).

The control processing is carried out independently for the I and Q channels, thus providing independent quadrature polynomial models of the amplifier characteristic. Since the control scheme for each of the predistorters 510 and 512 is essentially the same, only that for the predistorter 512 operating on the quadrature channel digital input signal will now be described.

Each of the odd orders of distortion 522,524,526,528 generated in predistorter 512 are provided to an input of a respective mixer 530,532,534,536 to the other input of which is supplied a quadrature-shifted, offset local oscillator signal from generator 538. It will be appreciated that quadrature splitter 540 provides a corresponding in-phase version of the offset local oscillator signal to the control mechanism for predistorter 510. Returning to the control mechanism for predistorter 512, the outputs of mixers 530,532,534,536 represent the orders of distortion generated within the predistorter 512 as upconverted by the offset local oscillator signal. These signals are converted to analogue signals and are supplied to inputs of mixers 542,544,546,548. These mixers correlate the offset-upconverted distortion orders with the feedback signal provided to splitter 520.

The resulting audio range signals are sampled by a bank of analogue to digital converters and are fed to a further set of correlating mixers 550,552,554,556 within the DSP. To the other input of each of these mixers is supplied a signal derived from the correlation of the output of offset local oscillator 538 with the signal from the local oscillator 558 (in upconverter 514) at 560. The LOs 558 and 538, respectively, could have frequencies of 70 MHz and 70.001 MHz, the output of mixer 560 being at 1 KHz, the off-set frequency.

The outputs of correlators 550,552,554,556 are then integrated to supply control signals for the amplitude adjusting elements of the predistorter 512 (which were described with reference to FIG. 2). Equally, the control signals produced by the integrators could be used to control the phase adjusting elements of the predistorter 512. In this way, feedback control of the predistorters 510 and 512 is achieved. Since the integration and the preceding correlation takes place digitally any possibility of DC drift or offsets degrading the level of (intermodulation) distortion is eliminated. In order for the processing to remain coherent, it is necessary for the DSP clock and the RF local oscillator(s) to be derived from the same source, or to be phase locked in some way. The simplest method of achieving this is to drive both the DSP clock and the local oscillator(s) from the same crystal reference oscillator.

It should be noted that the system could be operated in polar (amplitude and phase) format in place of the Cartesian (I & Q) format described above.

Figure 6:
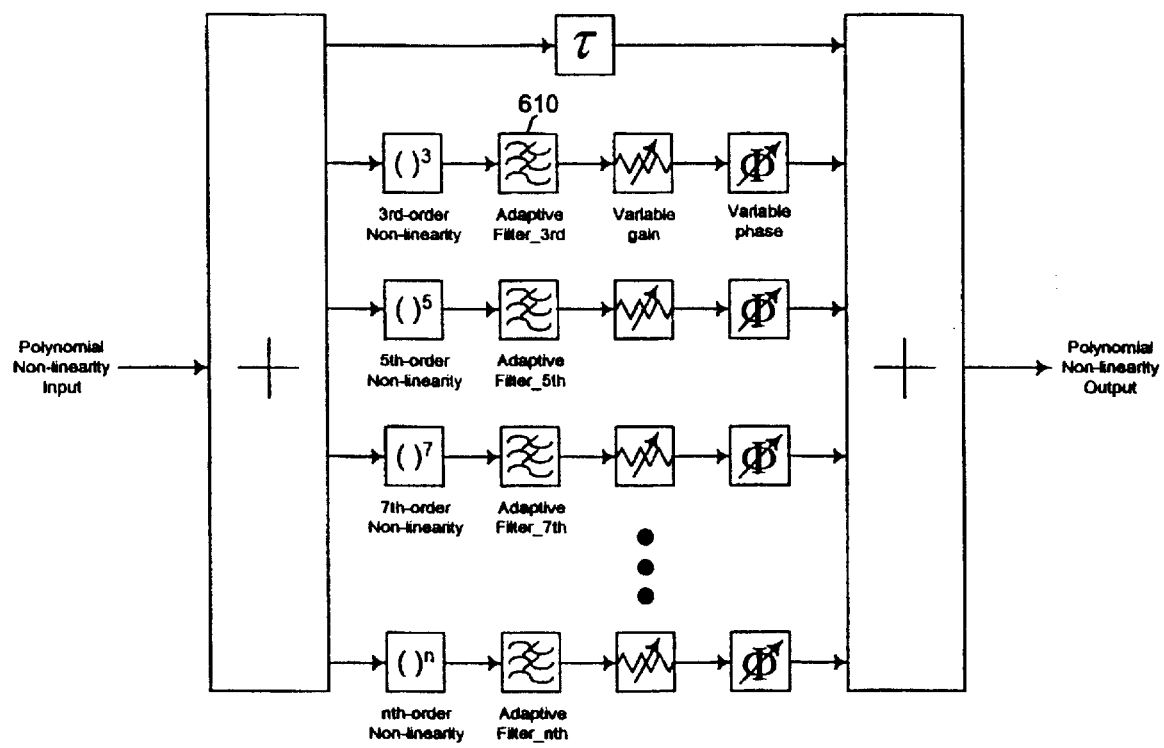
FIG. 6 is a diagram illustrating a predistortion circuit.

It is possible to include adaptive filtering within the predistorters to create a controlled arbitrary amplitude and/or phase versus frequency characteristic for each order of distortion generated. This can enable linearisation of an output signal which would otherwise experience unequal intermodulation distortion. As shown in FIG. 6, the basic predistortion scheme, as illustrated in FIG. 2, can be adapted by the inclusion of an adaptive filter 610, etc. in each of the paths for generating the various orders of distortion. These filters can be implemented digitally, and can be of recursive or non-recursive type, and may be adapted using a feedback signal from the output of the RF power amplifier.

The basic system may also be modified to use a pilot signal which is injected into the main signal path prior to upconversion and amplification. The pilot tone would be created within the DSP (using, for example, a numerically controlled oscillator) and added prior to upconversion of the I and Q input signals to the IF band. The pilot signal will be subject to cross-modulation distortion from the input signal proper during the upconversion and amplification processes, and this cross-modulation distortion can be fed back from the output of the RF power amplifier to control the predistorters as described in UK Patent Application 9814391.0. The cross modulation components afflicting the pilot signal can be minimised using the feedback control mechanism which, in turn, leads to minimisation of the related distortion of the main signal due to intermodulation processes.

What is claimed is:

1. A method of linearizing an output signal comprising the steps of providing an input signal, digitally predistorting the input signal using polynomial distortion generation and frequency converting it in succession to provide a predistorted, frequency-converted signal, and amplifying the predistorted, frequency-converted signal to produce an output signal, wherein the predistorting step comprises producing a predistortion from the input signal for introduction to the input signal by generating different orders of distortion from the input signal and controlling the orders of distortion independently.

2. A method according to claim 1, wherein the predistortion of the input signal occurs prior to its frequency conversion.

3. A method according to claim 1, wherein the frequency converting step is a frequency up-converting step.

4. A method according to claim 1, wherein the input signal is in quadrature form comprising in-phase and quadrature channels, and the predistorting step comprises the step of predistorting each channel independently.

5. A method according to claim 1, wherein the predistorting step comprises the step of controlling the amplitude and/or phase of the predistortion.

6. A method according to claim 1, wherein the predistorting step comprises a step of controlling the predistortion to introduce a variation of amplitude and/or phase with frequency into the predistortion.

7. A method according to claim 1, comprising the step of controlling the predistortion on the basis of a feedback signal derived from the output signal.

8. A method according to claim 7, comprising the step of introducing a pilot signal into the input signal and wherein the step of controlling the predistortion on the basis of a feedback signal comprises the step of monitoring distortion of the pilot signal in the output signal.

9. A method according to claim 7, further comprising the step of using the predistortion together with the feedback signal to generate control signals for the predistortion step.

10. A method according to claim 9 wherein the step of using the predistortion together with the feedback signal to generate control signals comprises the step of correlating the predistortion with the feedback signal.

11. A method according to claim 10, comprising the step of frequency converting the predistortion prior to the correlating step.

12. A method according to claim 11, wherein the step of frequency converting the predistortion comprises the step of mixing the predistortion with a first signal at a first frequency.

13. A method according to claim 12, wherein the step of frequency converting the input signal comprises the step of mixing it with a signal at a second frequency and the correlating step comprises the step of mixing the frequency converted predistortion with the feedback to produce intermediate signals.

14. A method according to claim 13, wherein the correlating step comprises the step of correlating the intermediate signals with a signal whose frequency is the difference of the first and second frequencies.

15. A method according to claim 9, wherein the step of using the predistortion together with the feedback signal to generate control signals is performed at least partly in an analogue signal domain.

16. A method according to claim 1, wherein the predistorting step comprises, mixing or multiplying the input signal with itself to generate a distortion signal.

17. A method according to claim 1, wherein the predistorting step comprises generating different orders of distortion by mixing the input signal with itself repeatedly.

18. A method according to claim 1, wherein the predistortion occurs in a digital signal processor.

19. A method according to claim 1, wherein the frequency conversion of the input signal occurs in a digital domain.

20. A method of transmitting information wirelessly, comprising the step of manipulating the information to produce an input signal and processing the input signal by the method of any preceding claim in order to generate an output signal for transmission from antenna means.

21. Apparatus for linearising an output signal comprising predistorting means for digitally predistorting an input signal using polynomial predistortion generation and frequency converting means operating in succession on an input signal to provide a predistorted, frequency-converted signal, and amplifying means for amplifying the predistorted, frequency-converted signal to produce an output signal, wherein the predistorting means produces a predistortion from the input signal for introduction to the input signal by generating different orders of distortion from the input signal and controlling the orders of distortion independently.

22. Apparatus according to claim 21, wherein the predistorting means operates on the input signal prior to the frequency converting means.

23. Apparatus according to claim 21, wherein the frequency converting means comprises frequency up-converting means.

24. Apparatus according to claim 21, wherein the input signal is in quadrature form comprising in-phase and quadrature channels, and the predistorting means comprises means for predistorting each channel independently.

25. Apparatus according to claim 21, wherein the predistorting means comprises means for controlling the amplitude and/or phase of the predistortion.

26. Apparatus according to claim 21, wherein the predistorting means comprises means for controlling the predistortion to introduce a variation of amplitude and/or phase with frequency into the predistortion.

27. Apparatus according to claim 21, comprising control means for controlling the predistortion on the basis of a feedback signal derived from the output signal.

28. Apparatus according to claim 27, comprising injecting means for introducing a pilot signal into the input signal and wherein the control means comprises means for monitoring distortion of the pilot signal in the output signal.

29. Apparatus according to claim 27, further comprising control signal generating means for using the predistortion together with the feedback signal to generate control signals for the predistorting means.

30. Apparatus according to claim 29, wherein the control signal generating means comprises correlating means for correlating the predistortion with the feedback signal.

31. Apparatus according to claim 30, comprising predistortion frequency converting means for frequency converting the predistortion prior to its correlation by the correlating means.

32. Apparatus according to claim 31, wherein predistortion frequency converting means comprises predistortion mixing means for mixing the predistortion with a first signal at a first frequency.

33. Apparatus according to claim 32, wherein the frequency converting means for frequency converting the input signal comprises means for mixing it with a signal at a second frequency and the correlating means comprises means for mixing the frequency converted predistortion with the feedback to produce intermediate signals.

34. Apparatus according to claim 33, wherein the correlating means comprises means for correlating the intermediate signals with a signal whose frequency is the difference of the first and second frequencies.

35. Apparatus according to claim 29, wherein the control signal generating means operates at least partly in an analogue signal domain.

36. Apparatus according to claim 21, wherein the predistorting means comprises means for mixing or multiplying the input signal with itself to generate a distortion signal.

37. Apparatus according to claim 21, wherein the predistorting means comprises order generating means for generating different orders of distortion by mixing the input signal with itself repeatedly.

38. Apparatus according to claim 21, wherein the predistorting means is implemented by a digital signal processor.

39. Apparatus according to claim 21, wherein the means for frequency converting the input signal operates in a digital domain.

40. Apparatus for transmitting information wirelessly, comprising means for manipulating the information to produce an input signal and apparatus of claim 21 for processing the input signal in order to generate an output signal for transmission from antenna means.

* * * * *